US006259656B1

(12) United States Patent
Kotanagi

(10) Patent No.: US 6,259,656 B1
(45) Date of Patent: Jul. 10, 2001

(54) THERMOELECTRIC UNIT AND TIMEPIECE USING IT

(75) Inventor: Susumu Kotanagi, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/403,128

(22) PCT Filed: Feb. 17, 1999

(86) PCT No.: PCT/JP99/00719

§ 371 Date: Feb. 14, 2000

§ 102(e) Date: Feb. 14, 2000

(87) PCT Pub. No.: WO99/41648

PCT Pub. Date: Aug. 19, 1999

(30) Foreign Application Priority Data

Feb. 17, 1998 (JP) ........................................ 10-034730
Feb. 24, 1998 (JP) ........................................ 10-042542

(51) Int. Cl.[7] .............................. G04B 1/00; H01L 35/00
(52) U.S. Cl. .............................. 368/204; 368/203; 136/205
(58) Field of Search .............................. 368/203, 205; 136/205, 230, 242

(56) References Cited

U.S. PATENT DOCUMENTS 4,106,279 * 8/1978 Martin et al. .......................... 368/204
5,517,468 * 5/1996 Inoue et al. .......................... 368/203
5,889,735 * 3/1999 Kawata et al. .......................... 368/204
5,974,002 * 10/1999 Tsubata .......................... 368/204
6,075,199 * 6/2000 Wong .......................... 136/205
6,075,757 * 6/2000 Kawata .......................... 368/204

OTHER PUBLICATIONS

Nakayashiki Kazuhiro, Patent Abstract of Japan, Publication Number 10111368, Apr. 1998.*

* cited by examiner

*Primary Examiner*—Vit Miska
*Assistant Examiner*—Jeanine-Marguerite Goodwin
(74) *Attorney, Agent, or Firm*—Adams & Wilks

(57) ABSTRACT

A structure in which destruction of electrothermic elements due to external force is prevented. Connection with the output terminal of a thermoelectric generator unit and with a movement are facilitated. The structure has a good efficiency of heat conduction.

A frame 119 is mounted around the electrothermic elements, 111. A heat-absorbing plate 112 and a heat-dissipating plate 118 are firmly mounted to the top and bottom of the frame 119. A buffer member 121 having thermal conductivity is loaded or placed between the electrothermic elements 111 and the heat-absorbing plate 112 or the heat-dissipating plate 118. Thus, the electrothermic elements 111 make a unit structure. The electrothermic elements 111 are connected in series. An electrode portion 114*a* is at the final end. This electrode portion 114*a*, the heat-absorbing plate 112, and the heat-dissipating plate 118 are connected to form an electromotive force output means.

17 Claims, 9 Drawing Sheets

THERMOELECTRIC UNIT AND TIMEPIECE USING IT

TECHNICAL FIELD

The present invention relates to a thermoelectric generator unit for producing energy/using electrothermic elements and, more particularly, to a thermoelectric timepiece driven by the energy.

BACKGROUND ART

Thermoelectric wristwatches using thermoelectric for elements producing electromotive force based on the Seebeck effect as an energy source instead of or as a supplement to batteries have been disclosed.

FIG. 2 is a cross-sectional view showing the structure of the prior art thermoelectric timepiece using electrothermic elements as an energy source.

The thermoelectric timepiece is a timepiece structure comprising a movement 201, a thermoelectric generator 202, an electrical energy storage device (not shown), a metallic bottom portion 203, a frame portion 204 made of a thermally insulating material, and a metallic top portion 205. An electrothermic wristwatch of the construction described thus far is disclosed, for example, in Japanese Patent Publication No. 13279. However, thermoelectric generator units which have sufficient capability to generate power and are designed, taking miniaturization into account, have not been put into practical use. Also, electrothermic timepieces using such thermoelectric generator units have not been put into practical use. In addition, details of the structure of this thermoelectric generator unit are not disclosed.

An electrothermic element can produce an electromotive force in response to a temperature difference between a heat-absorbing side that is a first support member and a heat-dissipating side that is a second support member. As the temperature difference increases, the electromotive force increases. When one attempts to obtain a large electromotive force, the efficiency of absorption of heat from the heat source and the efficiency of dissipation of heat from the electrothermic element should be enhanced. For this purpose, it is necessary to secure a highly efficient thermally conductive path for conducting heat from the rear cover to the electrothermic element efficiently and for dissipating heat from the electrothermic element to the case body and to the outside air.

However, electrothermic elements are vulnerable to external forces. Especially, n- and p-type semiconductors take the form of elongated pillars and are arrayed vertically in large quantities. Therefore, if a lateral force or excessive vertical force is applied relative to the direction of conduction of heat through the n- and p-type semiconductors, there arises a danger of destruction of the electrothermic elements. Consequently, sufficient force cannot be applied when the heat-absorbing member, the heat-dissipating member, and the electrothermic elements are brought into contact with each other and thus it has been impossible to improve the efficiency of heat conduction.

Where heat from an arm that becomes a heat source should be efficiently taken into the electrothermic elements, it is desired that the electrothermic elements be placed on the rear cover of the time piece. Where the ease of assembly and disassembly of the electrothermic timepiece is taken into account, connector structures for connection of the output terminals of the electrothermic elements with a step-up charging circuit and a secondary cell mounted in the body of the timepiece cannot be easily accomplished.

To improve the efficiency of power generation, it is desired that pressure be applied to lower the thermal contact resistance of members used for absorbing and dissipating heat from the electrothermic element or thermoelectric generator unit with the heat source or heat-dissipating means. However, materials having good thermal conductivities typically have low elastic module and sufficient force cannot be applied. Hence, the thermal contact is unstable.

Accordingly, it is an object of the present invention to provide a structure that prevents electrothermic elements from being destroyed due to external force, facilitates connection of the output terminals of thermoelectric generator units with a step-up charging circuit and with a secondary battery, and offers good efficiency of thermal conduction.

DISCLOSURE OF THE INVENTION

To solve the problems with the prior art technique (i.e., the strength of the electrothermic elements is low, it is difficult to take up the generated electromotive force, connection with a step-up charging circuit and with a secondary battery cannot be easily made, and the thermal contact of the heat-dissipating side of the thermoelectric generator unit with the heat-conducting means is unstable), the present invention provides a unit structure in which electrothermic elements are protected with members for absorbing and dissipating heat from the thermoelectric generator unit. The heat-absorbing member and the heat-dissipating member of the thermoelectric generator unit are used as electrodes. Furthermore, these members for absorbing and dissipating heat from the thermal generator unit are electrical output means. Electrical connector means are provided for connection with a step-up charging circuit and with the secondary battery. The electrical connector means also functions to apply pressure to heat-conducting means such that it is contacted, for improving the efficiency of heat dissipated from the thermoelectric generator unit. In this way, the members for absorbing and dissipating heat from the thermoelectric generator unit are made to act as the electrical output means. Therefore, electrical connection is facilitated. The heat-conducting means and the electrical connecting means are a common structure. Hence, the structure has a good efficiency of thermal conduction. Electrical connection is easy to make.

BEST MODE FOR CARRYING OUT THE INVENTION

Figure 1:
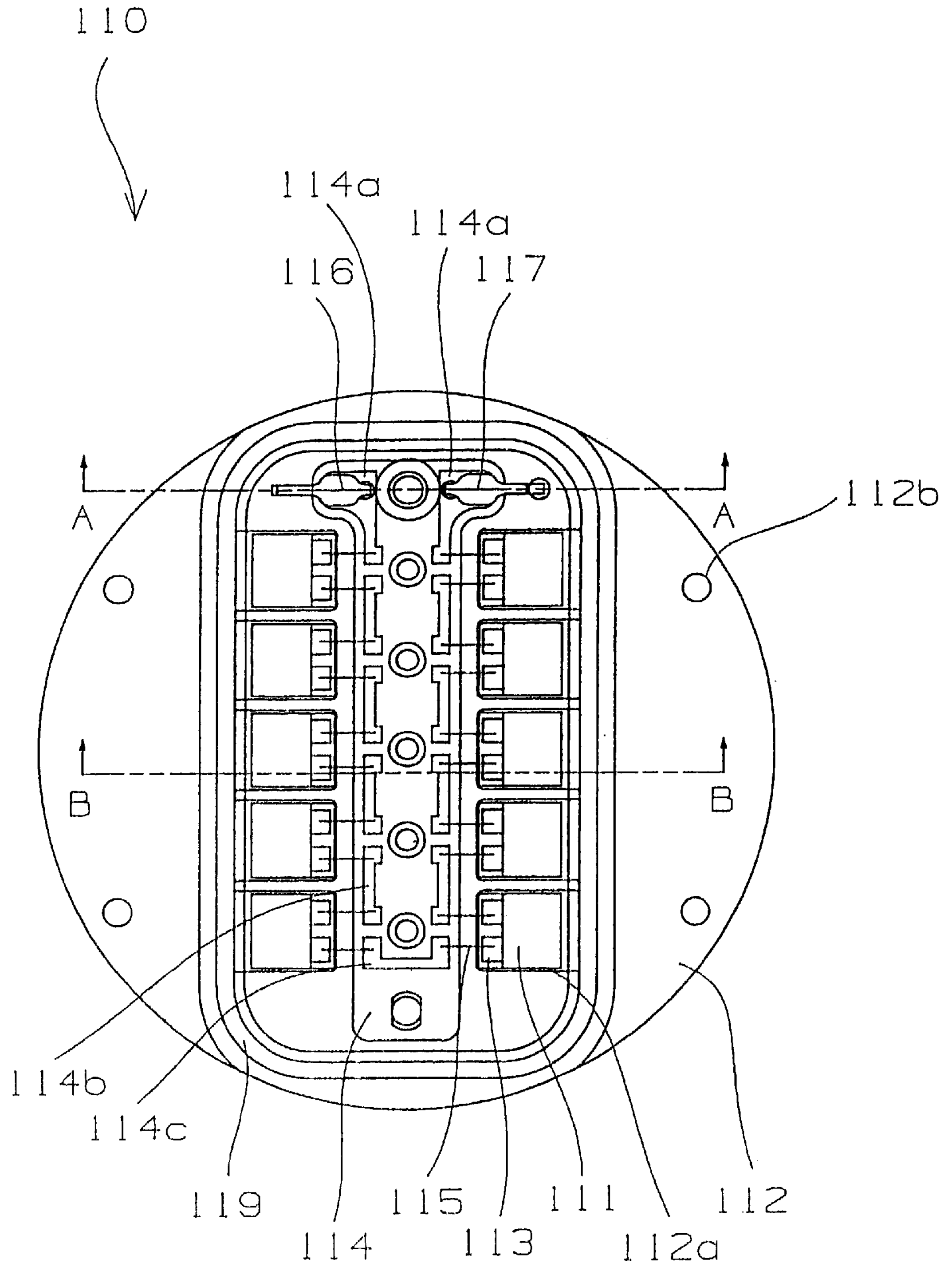
FIG. 1 is a plan view showing a thermoelectric generator unit in accordance with the present invention in which a heat-dissipating unit has been removed.
Figure 2:
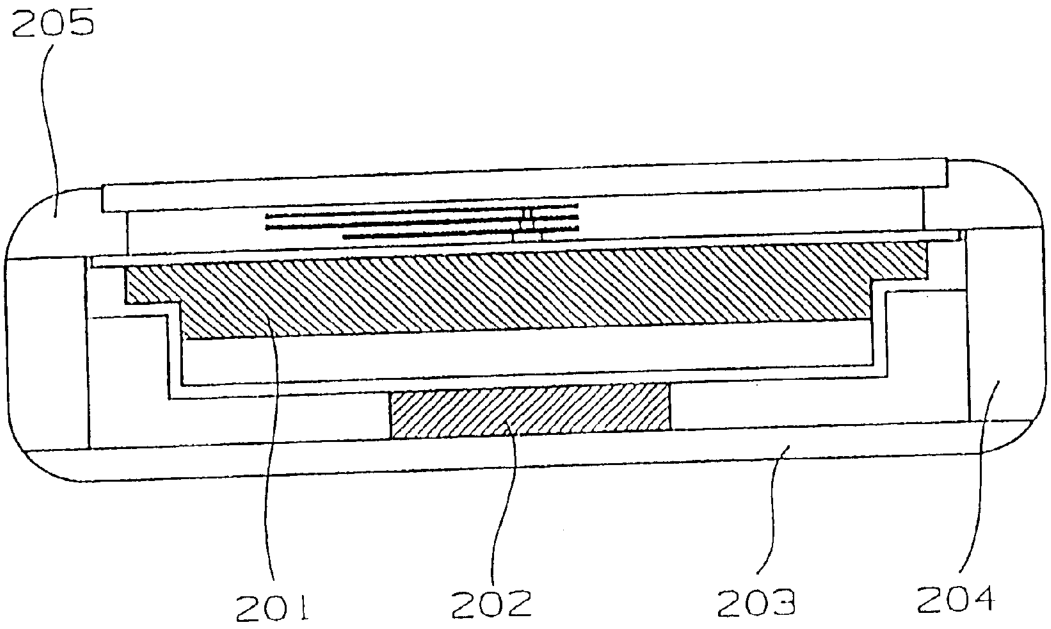
Fig. 2 PRIOR ART
FIG. 2 is a cross-sectional view showing the structure of the prior art thermoelectric timepiece.

In a thermoelectric generator unit in accordance with the present invention, the output terminals of electrothermic elements are connected with a heat-absorbing member such as a plate and with a heat-dissipating member such as a plate as means for delivering an electromotive force generated by the electrothermic elements. For example, the positive terminal is connected with the heat-dissipating member, and the negative terminal is connected with the heat-absorbing plate.

As a structure of the thermoelectric generator unit, at least one electrothermic element is placed either on the heat-absorbing member or on the heat-dissipating member and firmly mounted to it by a holding means that mounts the electrothermic element.

The heat-absorbing member is made of a material having good thermal conductivity and has an outside diameter almost identical to the inside diameter of the rear cover of the time piece. This concentrates heat from the rear cover in the electrothermic element portion. Therefore, efficient use of heat from the rear cover can be made.

A means for protecting the electrothermic elements is placed between the heat-absorbing member and the heat-dissipating member and firmly held there. The electrothermic elements are connected in series by electrical connector means, thus forming a unit structure.

The heat-absorbing side of the thermoelectric generator unit of the structure described above is placed on and firmly mounted to the rear cover composed of a frame and the heat-absorbing member. The frame is made of a heat-insulating material, while the heat-absorbing member is made of a thermally conductive material. The frame made of a heat-insulating member, the rear cover, and the case body are held by fixing means such as screws. The rear cover and the case body are made of thermally conductive materials.

A heat-conducting plate that is a heat-conducting means is brought into contact with the heat-dissipating side of the thermoelectric generator unit and with the case body and held there. This forms a heat-conducting path for heat absorbed from the rear cover.

The connector terminals that are electrical connector means are in contact with output terminals of the thermoelectric generator unit at the heat-absorbing member and the heat-dissipating member, respectively. The electrical connector means have resilience and are brought into contact with the output means of the thermoelectric generator unit that are the heat-absorbing plate and the heat-dissipating plate.

The connector terminals that are electrical connector means apply pressure to the heat conductive plate that is a thermal conducting means. This assures contact with the output terminals of the thermoelectric generator unit that is made of the heat-dissipating plate. Placing the connector terminals in plural locations ensures stable contact. Mounting the connector terminals on the movement facilitates making a connection with the step-up charging circuit and with a secondary battery that stores the generated electrical power.

The connector terminals use leaf springs or coil springs.

The thermoelectric generator unit structure in accordance with the present invention can be directly mounted on the rear cover. The connector terminals that are electrical connector means may touch the rear cover.

With the thermoelectric generator unit and the thermoelectric timepiece using this unit constructed as described above, a thermal conductive path is formed that conducts heat from the rear cover to the case cover via the heat-absorbing member and the heat-dissipating member of the thermoelectric generator unit and then via the heat-conducting means. The heat-conducting plate that is a heat-conducting means is pressed against and contacted with the heat-dissipating member acting also as the electrical output means of the thermoelectric generator unit by the connector terminals having resilience. The connector terminals are mounted on the movement and act as electrical connector means. Thus, an electrical conductive path connected to the movement is formed.

Because of this structure, the thermal conductive path and the electrical conductive path can be made of the same components.

Embodiments of the present invention are hereinafter described with reference to the attached drawings.

Figure 3:
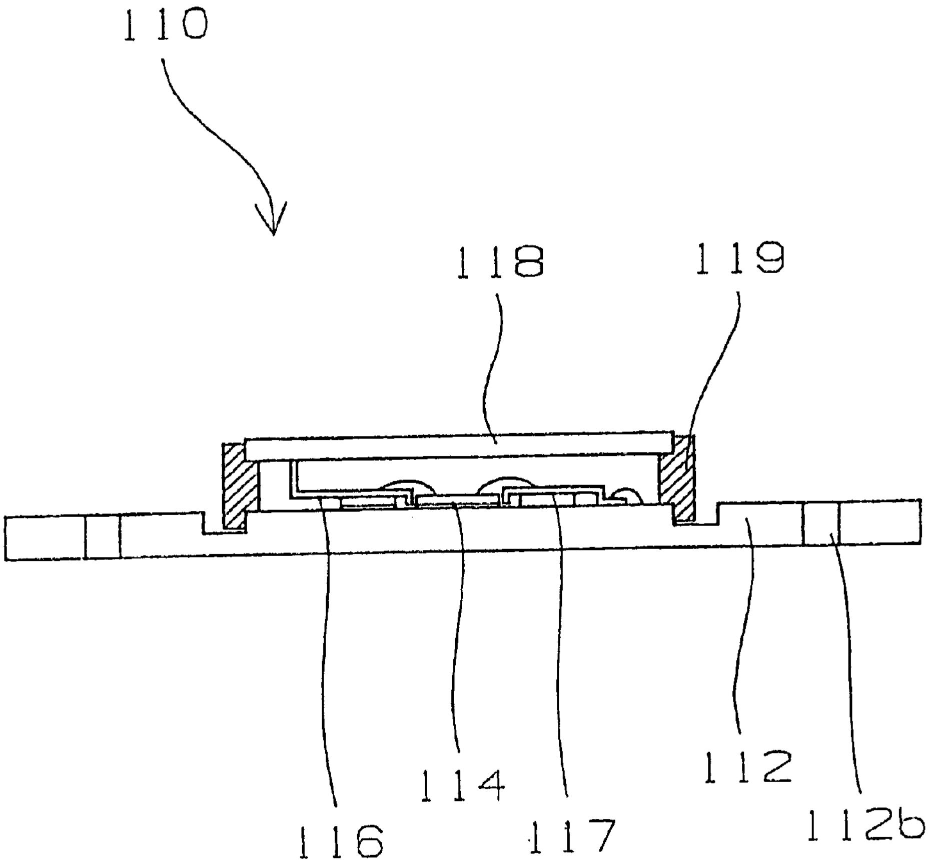
FIG. 3 is a cross-sectional view showing a portion indicated by the arrows A—A in FIG. 1.
Figure 4:
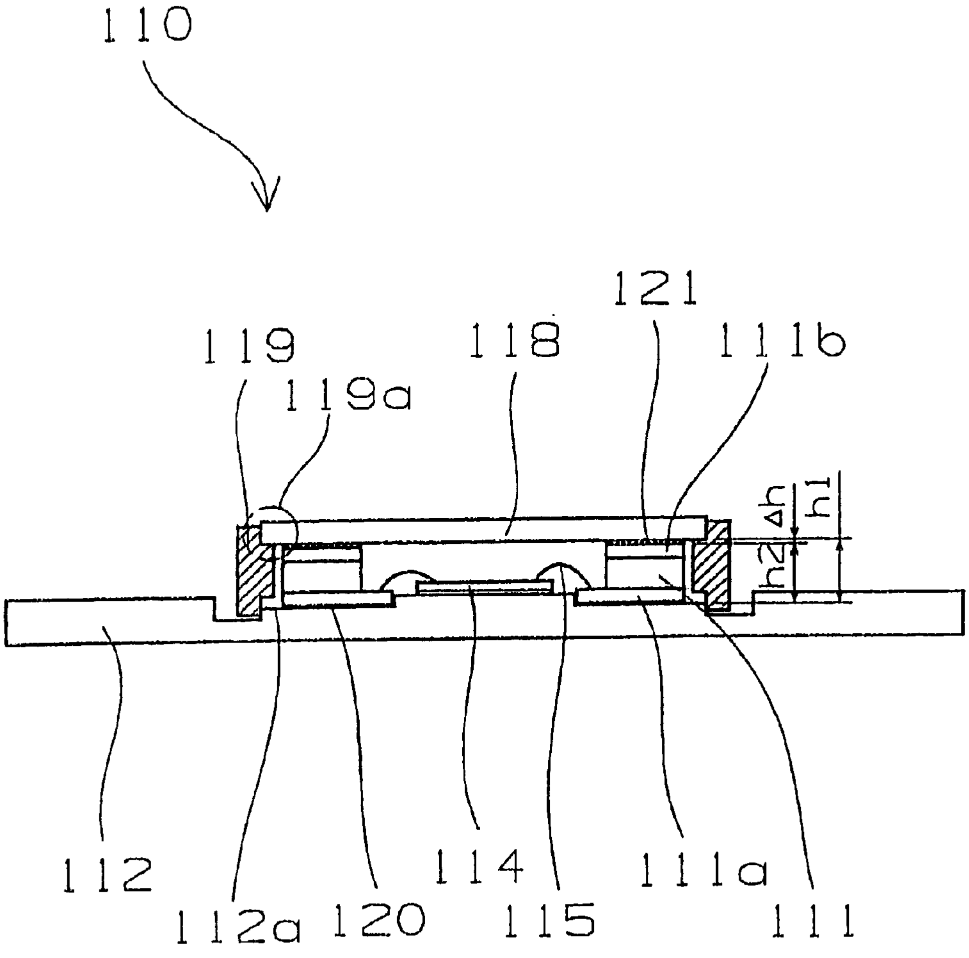
FIG. 4 is a cross-sectional view showing a portion indicated by the arrow B—B in FIG. 1.

FIG. 1 is a plan view of a thermoelectric generator unit 110 in accordance with the present invention, and in which a heat-dissipating plate 118 has been removed. FIG. 3 is a cross-sectional view taken along line A—A of FIG. 1. FIG. 4 is a cross-sectional view taken along line B—B of FIG. 1.

In the thermoelectric generator unit 110 in accordance with the present invention, electrothermic elements 111 are placed on a heat-absorbing plate 112 and rigidly mounted to it. The electrothermic elements 111 each have an electrode pattern 113, and a substrate 114 has connection patterns 114*b*, 114*c*. The electrothermic elements 111 are electrically connected in series with the connection patterns 114*b*, 114*c* by wires 115. Output terminal A 116 and output terminal B 117 are brought into contact with the heat-absorbing plate 112, or electrical output means, and the heat-dissipating plate 118 and firmly held to the output means, whereby the output terminals 116 and 117 are mounted to the final ends of the substrate 114 connected as described above. The heat-absorbing plate 112 is firmly affixed to one side of a frame 119 that is a protective means for the electrothermic elements 111. The heat-dissipating plate 118 is firmly mounted to the other side of the frame 119. The mounting means for firmly mounting the frame 119 to the heat absorbing plate 112 and the heat dissipating plate 118 can be adhesives, ultrasonic welding, and other methods.

The heat-absorbing plate 112 is made of a material having a high thermal conductivity such as copper or aluminum. The thermal conductivity ($\lambda$ in W/mK) of copper is 386. The thermal conductivity ($\lambda$) of aluminum is 228. The heat-absorbing plate 112 is provided with grooves 112*a* that serve as means for placing the electrothermic elements 111 in position.

A first support body 111*a* that is disposed or the heat-absorbing side of the electrothermic elements 111 is firmly held to the heat-absorbing plate 112 by a thermally conductive adhesive 120 that is a serves as means for holding the electrothermic elements 111. For example, the adhesive consists of epoxy resin to which 10–40% filler is added. The filler can be silver paste, carbon powder, or graphite. As electrical connecting means for connecting the electrothermic elements 111 in series, the substrate 114 is adhesively bonded to the heat-absorbing plate 112, and the electrode patterns 113 on the electrothermic elements 111 are electrically connected with the connection patterns 114*b*, 114*c* on the substrate 114 by the wires 115. The first output terminal 116 and the second output terminal 117 are electrically and mechanically firmly connected to the electrode pattern 114*a* that is at the final end of the connected substrate 114 by soldering, for example.

The frame 119 that saves as a protective means for the electrothermic elements 111 is firmly mounted to the heat-absorbing plate 112 by a material having a low thermal conductivity such as a resinous material (e.g., ABS and polycarbonate) whose λ value is from 0.1 to 0.2.

A step portion 119*a* is formed near the top of the frame 119, and the heat-dissipating plate 118 made of a material with a high thermal conductivity such as copper or aluminum is placed on the step portion 119*a* to conduct heat from the electrothermic elements 111. Note that the λ value of copper is 386 and be λ value of aluminum is 228. The top position h2 of the electrothermic elements 111 is made lower than the top position h1 of the frame 119 by an amount equal to the tolerance in machining parts. A space Δh is formed between a second support body 111*b* for the electrothermic elements 111 and the bottom surface of the heat-dissipating plate 118.

Note that h1 and h2 indicate dimensions based on the surface of the grooves 112*a* in the heat-absorbing plate 112 in the direction of height.

The space Δh formed by the aforementioned structure is filled with a buffer member 121 having good thermal conductivity, such as silicone grease to which 10–40% of a filler such as silver powder or alumina is added, or in which a sheet of silicone gel is placed. The heat-dissipating plate 118 is guided by the frame 119 and firmly mounted.

Figure 5:
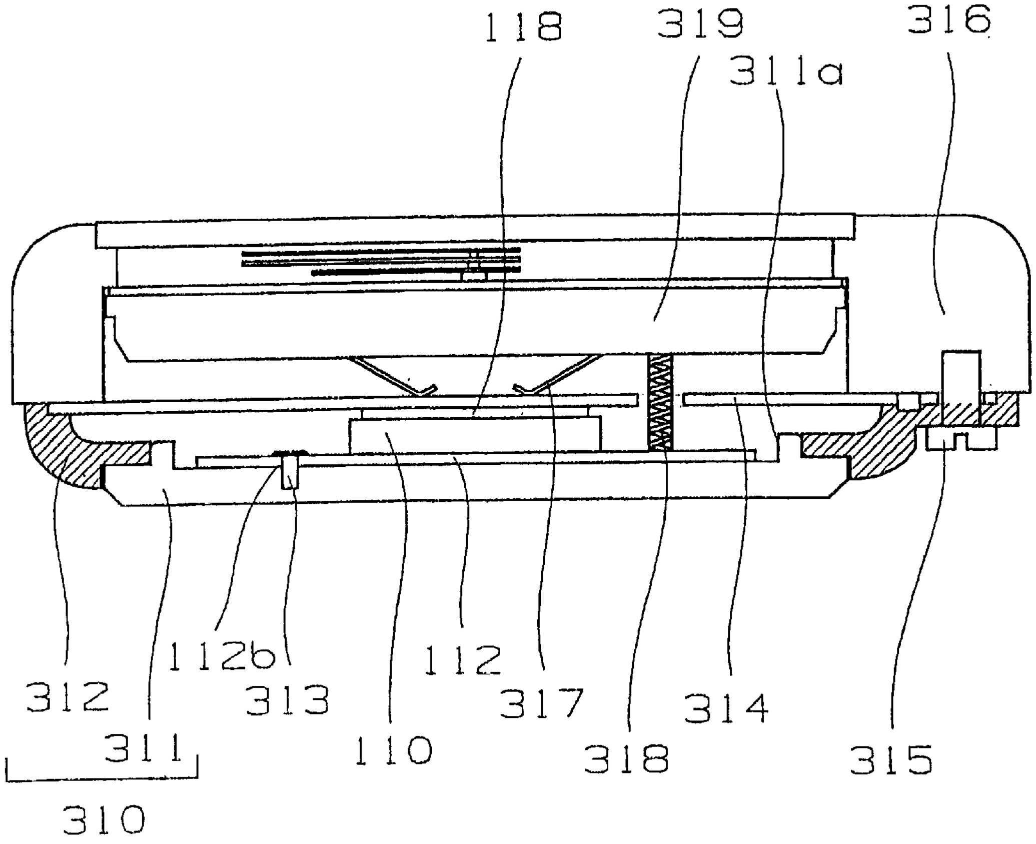
FIG. 5 is a cross-sectional view of an electrothermic timepiece using a thermoelectric generator unit in accordance with the invention.

FIG. 5 is a cross-sectional view showing the structure of a thermoelectric timepiece using the thermoelectric generator unit 110 in accordance with the invention. A rear cover 310 is made of a metallic rear cover body 311 and a frame 312 which are firmly bonded together at their interface. The frame 312 is made of a heat-insulating material such as a resinous material (e.g., ABS and polycarbonate) whose λ value is from 0.1 to 0.2.

The thermoelectric generator unit 110 is mounted to an inner side surface 311*a* of the rear cover body 311 of the rear cover 310 by coupling means such as screws 313 or the like extending through holes 112*b* formed in the heat-absorbing plate 112. The heat-absorbing plate 112 is shaped to conform to the profile of the inner side surface 311*a* of the rear cover 310. This can improve the efficiency of absorption of heat from the rear cover.

A thermally conductive plate 314 is mounted in contact with the top surface of the thermoelectric generator unit 110 on the heat-dissipating side. The frame 312 is mounted to a case body 316 with screws 315. As a result, the thermally conductive plate 314 is contacted with the case body 316 and fixed.

A first electrical connector means having a resilient force such as a first connector terminal 317 that is made of a leaf spring and is a positive electrode is mounted under the movement 319. The first electrical connector means applies pressure to the heat-dissipating plate 118 of the thermoelectric generator unit 110 via the thermally conductive plate 314 and makes resilient contact with the plate 314, it being noted that the heat-dissipating plate 118 is one output means for electromotive force. A second connector terminal 318 that is made of a coil spring, for example, and is a negative electrode is mounted on the movement 319. The second electrical connector means applies pressure to the top surface of the heat-absorbing plate 112 of the thermoelectric generator unit 110 that is the other electromotive force output means and makes resilient contact with the plate 112. The first connector terminal 317 and the second connector terminal 318 mounted on the movement 319 make contact with the power-supply portion (not shown) of a step-up charging circuit or the like.

Figure 6:
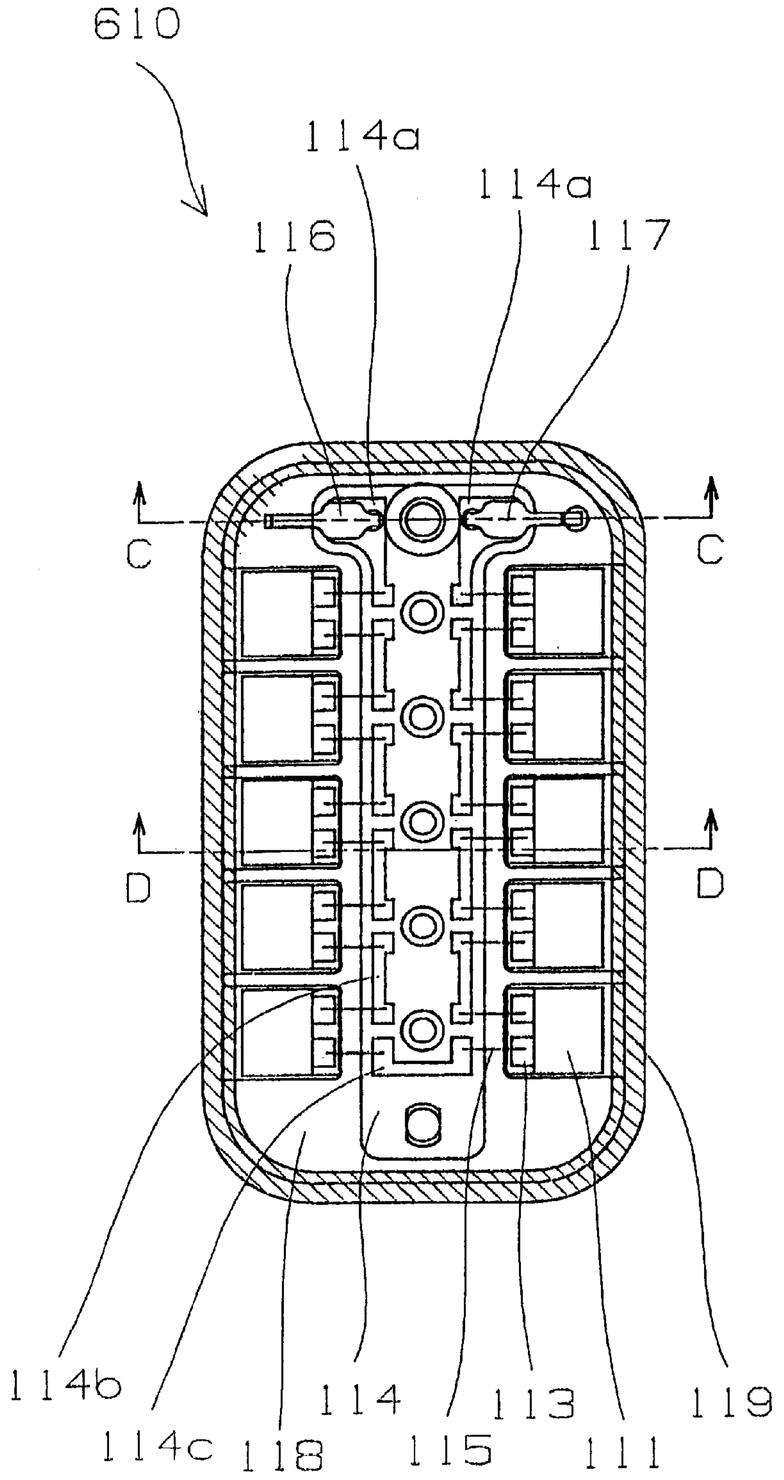
FIG. 6 is a plan view showing a state in which a heat-absorbing plate has been removed from a second embodiment of a thermoelectric generator unit in accordance with the invention.
Figure 7:
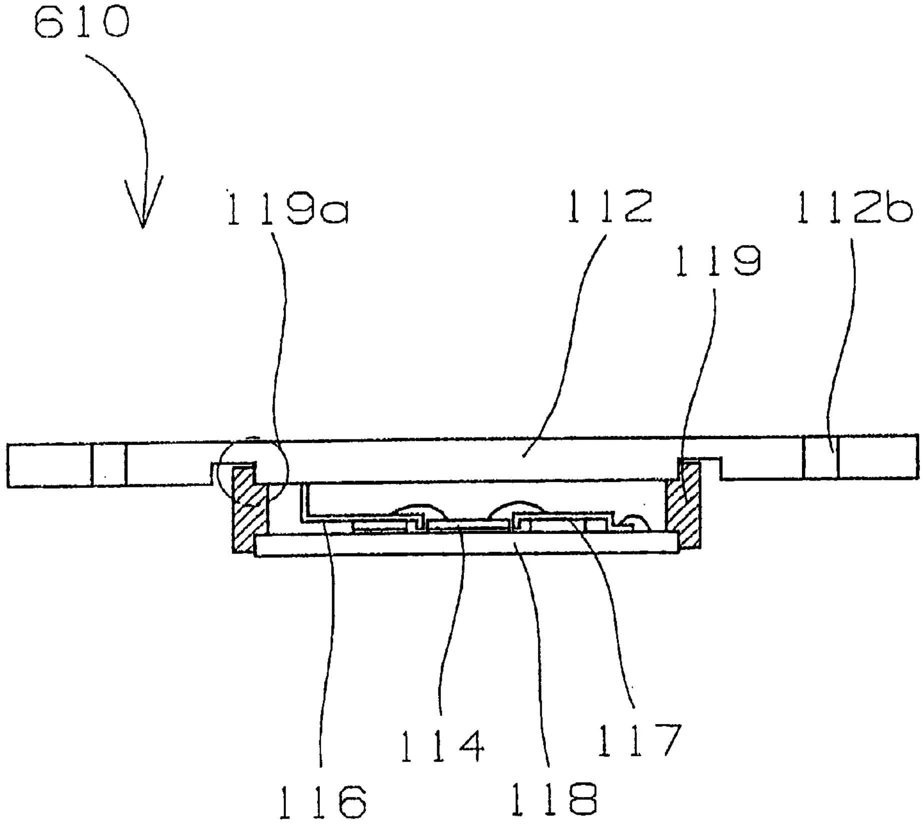
FIG. 7 is a cross-sectional view showing a portion indicated by the arrows C—C in FIG. 6.
Figure 8:
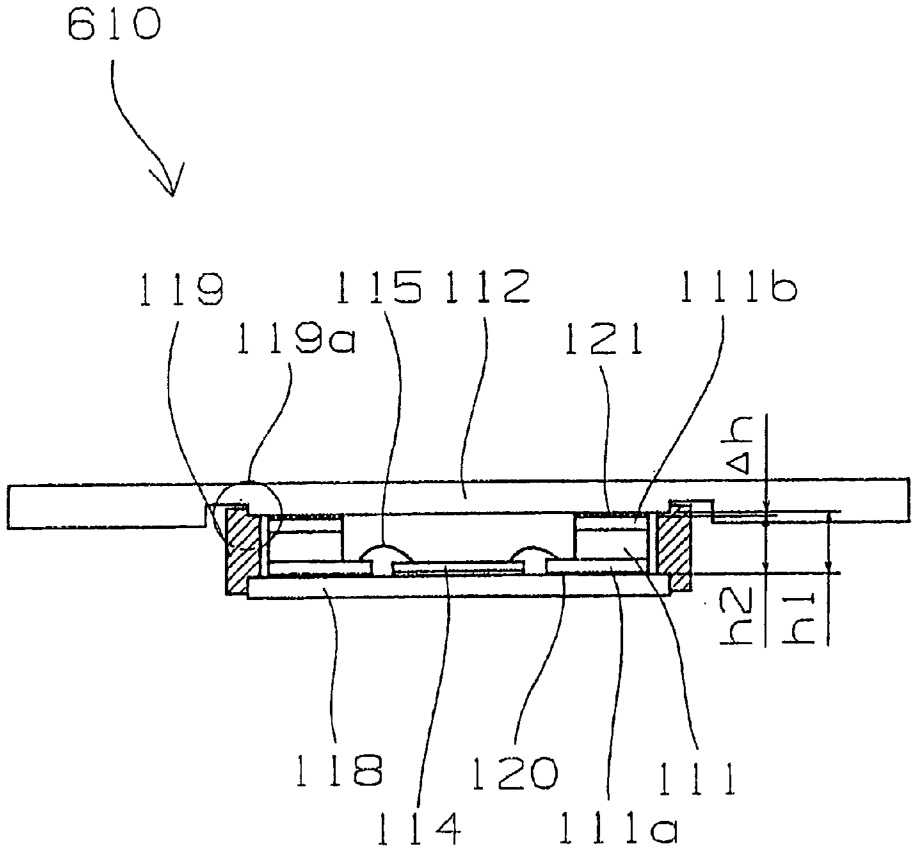
FIG. 8 is a cross-sectional view showing a portion indicated by the arrows D—D in FIG. 6.

FIG. 6 is a plan view of a second embodiment of the thermoelectric generator unit, 610, in accordance with the present invention, and in which the heat-absorbing plate 112 has been removed. FIG. 7 is a cross-sectional view taken on line C—C of FIG. 6. FIG. 8 is a cross-sectional view taken on line D—D of FIG. 6.

The first support body 111*a* for the electrothermic elements 111 is firmly bonded to the heat-dissipating plate 118 with the thermally conductive adhesive 120 rather than to the plate 112 as in the first embodiment. As electrical connector means for connecting the electrothermic elements 111 in series, the substrate 114 is bonded to the heat-dissipating plate 118, and the electrode patterns 113 on the electrothermic elements 111 are electrically connected with connection patterns 114*b*, 114*c* on the substrate 114 by the wires 115. The first output terminal 116 and the second output terminal 117 are electrically connected with the electrode pattern 114*a* that is the final end of the electrically connected substrate 114 by soldering, for example. These terminals are firmly mounted to the electrode pattern.

Then, the frame 119 acting as a means for protecting the electrothermic elements 111 is firmly secured to the heat-dissipating plate 118 with a material having a low thermal conductivity, in the same way as in the first embodiment.

The heat-absorbing plate 112 made of a material having a high thermal conductivity is rigidly mounted to the step portion 119*a* near the top of the frame 119 in the same manner as in the first embodiment. The top position h1 of the frame 119 is made higher than the top position h2 of the electrothermic elements 111 by an amount equal to the tolerance in machining parts. A space Δh is formed between the second support body 111*b* for the electrothermic elements 111 and the bottom surface of the heat-absorbing plate 112.

The aforementioned space Δh is filled with the buffer member 121 having thermal conductivity such as silicone grease, or a sheet of silicone gel is placed there in. The heat-absorbing plate 112 is guided by the frame 119 and securely mounted.

Figure 9:
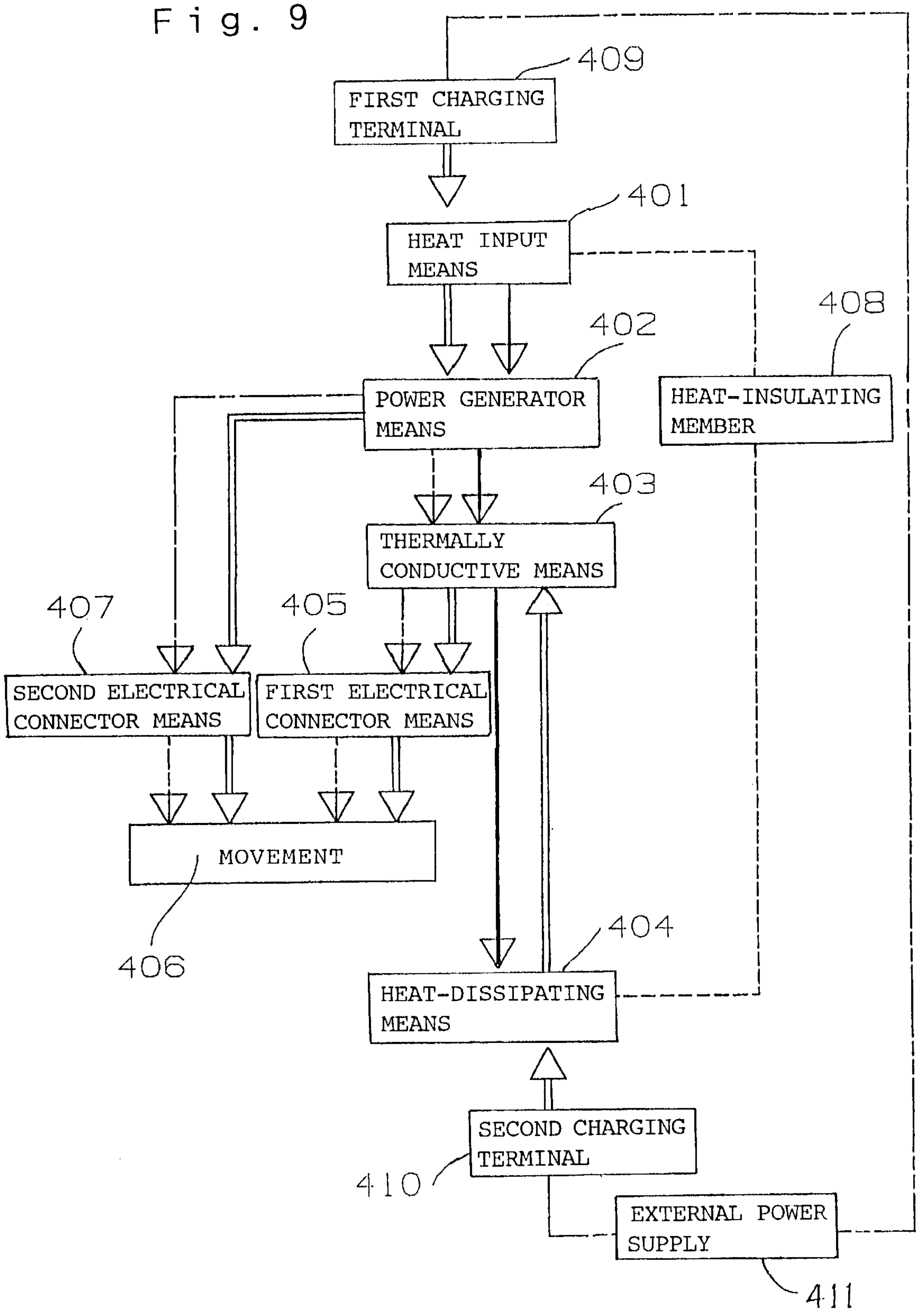
FIG. 9 is a flowchart illustrating the configuration of a thermoelectric timepiece in accordance with the present invention.

FIG. 9 is a flowchart illustrating the configuration of the thermoelectric timepiece in accordance with the present invention.

When the timepiece is worn on an arm, heat from the arm is absorbed into a heat-absorbing member 311 on the rear cover via a heat input means 401. The heat absorbed into the heat input means 401 is transmitted to a power generator means 402 as indicated by the solid line, the power generator means consisting of the electrothermic elements 111, the heat-absorbing member 112, the heat-dissipating member 118, and the protective means 119 for the thermoelectric elements 111. The heat transmitted to the power generator means 402 is transmitted to a heat-dissipating means 404 through a heat conduction means 403, the heat-dissipating means 404 being made of the case body 316. Since the heat-dissipating means 404 is in touch with the outside air, the transmitted heat is dissipated into the outside air through the heat-dissipating means 404. During this process, a temperature difference is produced across the power generator means 402, resulting in an electromotive force.

The heat-absorbing member 311 that is the heat input means 401 and the case body 316 that is the heat-dissipating means 404 are supported by the frame 312 of the rear cover that is a heat-insulating member 408 and interrupts conduction of heat as indicated by the broken lines.

The electromotive force generated by the power generator means 402 connects one electrode with the movement 406 by a first electrical connector means 405 via the heat conduction means 403. The other electrode is connected with the movement 406 by a second electrical connector means 407, thus supplying an electromotive force.

Electrical power is supplied from an external power supply 411 to the movement 406 by making use of the structure of the thermoelectric timepiece in accordance with the present invention. This will be described next.

A first charging terminal 409 of the external power supply 411 is contacted with the heat input means 401. A second charging terminal 410 of the external power supply 411 is contacted with the heat-dissipating means 404. The first charging terminal 409 and the second charging terminal 410 touch the external power supply 411 as indicated by the phantom lines. The electrical power conducted to the heat input means 401 from the first charging terminal 409 is coupled to the secondary battery (not shown) contained in the movement 406 via a conducting portion of the power generator means 402 and via the second electrical connector means 407 as indicated by the double solid lines. The electrical power conducted to the heat-dissipating means 404 from the second charging terminal 410 is supplied to the secondary battery (not shown) contained in the movement 406 via the heat conduction means 403 and via the first electrical connection means 405 as indicated by the double solid lines, thus charging the battery.

INDUSTRIAL APPLICABILITY

The present invention is practiced in the form as described thus far and produces the following effects.

The heat-dissipating plate and the heat-dissipating plate for the thermoelectric generator unit are used as electrodes. This simplifies the electrical power output structure. Paths for electrical connection and for thermal conduction can both be formed.

An electrical connector means that is brought into resilient contact with the thermal conduction plate is provided. This stabilizes the contact between the heat-dissipating plate and the heat conduction plate of the thermoelectric generator unit and improves the efficiency of thermal conduction. This increases the temperature difference between the heat-absorption side and the heat-dissipation side. This improves the power generation performance.

Furthermore, the electrical connector means that is brought into resilient contact with the heat conduction plate acts also as an electrode terminal. This achieves a reduction in the number of components.

A lead terminal is mounted to the movement that is the other electrode. By fabricating this lead terminal in the form of a coil spring, leakage of heat flowing from the heat-absorbing plate to the movement can be prevented.

Additionally, the heat conduction structure and the electrical connector structure in accordance with the present invention make it possible to charge a secondary battery from an external power supply. This secondary battery can be easily charged without providing any dedicated terminal for charging.

I claim:

1. A thermoelectric timepiece using a thermoelectric generator unit, comprising:

a plurality of electrothermic elements firmly mounted between a first heat-absorbing member and a heat-dissipating member;

protecting means for protecting the electrothermic elements, the protecting means being fixedly mounted between the first heat-absorbing member and the heat dissipating member;

electromotive force output terminals one of which is connected to the first heat-absorbing member and the other of which is connected to the heat-dissipating member;

electrical connector means for connecting the electrothermic elements in series;

a case body;

a rear cover composed of a frame comprised of a heat-insulating member and a second heat-absorbing member formed of a thermally conductive material and being in contact with the first heat-absorbing member;

heat-conducting means held in contact with the case body; and a movement mounted inside the case body;

wherein the heat-dissipating member is in contact with the heat-conducting means, the first heat-absorbing member is shaped to conform to an inner surface of the second heat-absorbing member, the electrical connector means comprises first electrical connector means and second electrical connector means, one side of the first electrical connector means is in contact with the heat-dissipating member, and one side of the second electrical connector means is in contact with the first heat-absorbing member.

2. A thermoelectric timepiece using a thermoelectric generator unit according to claim 1; wherein the first electrical connector means and the second electrical connector means are resilient members and apply a bias force against the heat-dissipating member and the heat-absorbing member, respectively.

3. A thermoelectric timepiece using a thermoelectric generator unit according to claim 1; wherein the first electrical connector means applies pressure to the heat-conducting means and is in electrical contact therewith.

4. A thermoelectric timepiece using a thermoelectric generator unit according to claim 1; wherein the first electrical connector means is mounted to one or more locations on the movement.

5. A thermoelectric timepiece using a thermoelectric generator unit according to claim 2; wherein the first electrical connector means comprises one or more leaf springs.

6. A thermoelectric timepiece using a thermoelectric generator unit according to claim 2; wherein the second electrical connector means comprises one or more coil springs.

7. A thermoelectric timepiece using a thermoelectric generator unit according to claim 1; further comprising heat input means, a first charging terminal in contact with the heat input means, and a second charging terminal in contact with the heat input means and a heat-dissipating means, respectively, to supply electrical power to the timepiece.

8. A thermoelectric timepiece using a thermoelectric generator unit according to claim 7; wherein the heat input means comprises the second heat-absorbing member.

9. A thermoelectric timepiece using a thermoelectric generator unit according to claim 7; wherein the heat-dissipating means comprises the case body.

10. A thermoelectric generator comprising: a case having a heat-absorbing rear cover, a heat-dissipating front cover, and an insulating member disposed therebetween; a heat-absorbing member disposed against the rear cover for absorbing heat from a heat source external of the rear cover; a heat dissipating member in contact with the front cover for dissipating heat to ambient air external of the front cover; a plurality of series-connected electrothermic elements mounted between the heat-absorbing member and the heat-dissipating member; a solid frame formed of a heat-insulating material mounted between the heat-absorbing member and the heat-dissipating member and surrounding the electrothermic elements so that the heat-dissipating member, the heat-absorbing member and the electrothermic elements form a unitary structure; first and second electromotive force output terminals connected to the series-connected electrothermic elements, one of the output terminals being connected to the heat-absorbing member and the other being connected to the heat-dissipating member; a first electrical connector formed of a resilient member and having one side in contact with the heat-dissipating member; and a second electrical connector formed of a resilient member and having one side in contact with the heat-absorbing member.

11. A thermoelectric generator according to claim 10; wherein the a rear cover comprises a frame having a first member formed of a heat-insulating material and a second member formed of a thermally conductive material.

12. A timepiece according to claim 10; wherein the heat-absorbing member conforms to a shape of an inner surface of the second member of the rear cover.

13. A timepiece according to claim 10; wherein the first electrical connector and the second electrical connector are resilient members and apply a bias force to the heat-absorbing member and the heat-dissipating member, respectively.

14. A timepiece according to claim 10; wherein the first electrical connector comprises one or more leaf springs.

15. A timepiece according to claim 10; wherein the second electrical connector comprises one or more coil springs.

16. A timepiece according to claim 10; further comprising heat input means for receiving heat, heat-dissipating means for dissipating heat, and charging terminals comprising a first charging terminal and a second charging terminal in contact with the heat input means and the heat-dissipating means, respectively, to supply electrical power to the timepiece.

17. A timepiece according to claim 16; wherein the heat input means comprises the heat-absorbing member and the heat-dissipating means comprises the front cover of the case.

* * * * *